United States Patent
Lou et al.

(10) Patent No.: US 6,906,543 B2
(45) Date of Patent: Jun. 14, 2005

(54) PROBE CARD FOR ELECTRICAL TESTING A CHIP IN A WIDE TEMPERATURE RANGE

(75) Inventors: Choon-Leong Lou, Singapore (SG); Mei-Shu Hsu, Pa-The City (TW)

(73) Assignee: Star Technologies Inc., Hsin Chu Hsien (TW)

( * ) Notice: Subject to any disclaimer, the term of this patent is extended or adjusted under 35 U.S.C. 154(b) by 0 days.

(21) Appl. No.: 10/732,276

(22) Filed: Dec. 11, 2003

(65) Prior Publication Data

US 2004/0119463 A1 Jun. 24, 2004

(30) Foreign Application Priority Data

Dec. 18, 2002 (TW) ........................................ 91136601 A

(51) Int. Cl.[7] .............................................. G01R 31/02
(52) U.S. Cl. ........................ 324/754; 324/760; 324/762
(58) Field of Search ......................... 324/754, 760–762, 324/765, 158.1; 439/482, 912

(56) References Cited

U.S. PATENT DOCUMENTS

| 4,777,716 | A | * | 10/1988 | Folk et al. .................... 29/593 |
| 5,124,639 | A | * | 6/1992 | Carlin et al. ................ 324/760 |
| 5,550,482 | A | * | 8/1996 | Sano .......................... 324/758 |
| 6,037,785 | A | * | 3/2000 | Higgins ...................... 324/754 |
| 6,194,907 | B1 | * | 2/2001 | Kanao et al. ............... 324/760 |
| 6,373,271 | B1 | * | 4/2002 | Miller et al. ................ 324/760 |

FOREIGN PATENT DOCUMENTS

JP  2001281267 A  * 10/2001  .......... G01R/1/073

* cited by examiner

*Primary Examiner*—Minh N. Tang
(74) *Attorney, Agent, or Firm*—Connolly Bove Lodge & Hutz LLP; Larry J. Hume

(57) ABSTRACT

This disclosure provides a probe card for electrical testing a chip in a wide temperature range. The probe card includes a circuit board, a cover, a circular supporter positioned on the circuit board, at least a probe needle fixed on the circular supporter by an adhesive, and a flow line positioned in the space between the circuit board and the cover. Embodiments of the invention moderates the temperature of the probe card by introducing a fluid such as, for example, forced-air or nitrogen into the flow line to carry heat into or out of the probe card.

20 Claims, 6 Drawing Sheets

PROBE CARD FOR ELECTRICAL TESTING A CHIP IN A WIDE TEMPERATURE RANGE

BACKGROUND

This disclosure relates to a probe card for electrical testing a chip in a wide temperature range, and more particularly, to a probe card for electrical testing a chip in a wide temperature range between −120° C. and 450° C.

FIG. 1 is a top view of a probe card 10 for testing a chip according to the prior art. The probe card 10 comprises a circuit board 12, a circular supporter 14 positioned on the circuit board 12, a plurality of probe needles 16 positioned on the circular supporter 14 and wires 18 connected to the end of the probe needle 16.

FIG. 2 is a cross-sectional diagram showing the probe card 10 applied to the electrical testing of a chip 36 of a wafer 30 according to the prior art. The semiconductor wafer 30 is positioned on a wafer chuck 32 with a heater 34, and comprises a plurality of chips 36. The probe needle 16 connects to a wire 26 on the backside of the circuit board 12 through a channel 20. The wafer chuck 32 will rise during testing so that the tip of the probe needle 16 can contact a pad 38 of the chip 36. The heater 34 will heat the semiconductor wafer 30 during testing, and heat will transmit to the probe card 10 by thermal radiation or by thermal conduction through the tip of the probe needle 16.

FIG. 3 is a close-up cross-sectional view of FIG. 2. The circular supporter 14 comprises an incline 28 and the included angle between the incline 28 and the surface of the circuit board is 7 degrees. Besides, the probe needle 16 is fixed on the incline of the circular supporter 14 by an epoxy resin 24.

In order to prevent the horizontal position of the probe needle 16 from shifting due to the increased usage time, it is necessary to use the epoxy resin 24 to fix the probe needle 16 on the circular supporter 14. According to the prior art, the probe needle 16 and the circular supporter 14 are made of tungsten, alloy of tungsten and rhenium, and ceramics. Since these materials can sustain high and low temperatures without deterioration, the technical bottleneck of the probe card 10 for high temperature testing is at the circuit board 12 and the epoxy resin 24. Additionally, since the material will expand and shrink with temperature variation, physical and chemical variations will occur in the material used in the probe card 10 and the structure of the probe needle 16 when testing is performed at relatively high and low temperatures. As a result, testing cannot be performed smoothly.

The probe card of the prior art causes the following drawbacks when testing is performed at very high or low temperatures:
(1) The circuit board cannot sustain high temperature: the circuit board used in the conventional probe card is made of polyimide or FR-4 with glass fiber. The working temperature of these materials is between 25° C. and 85° C., and the electrical properties of the probe card beyond 85° C. may be different from room temperature. Additionally, after high temperature testing for a long time, these fiber polymers will generate poisons which endanger the health of the operator and the high temperature will also deform the shape of the polymer which will dramatically influence the progress of testing.
(2) The position of the probe needle will shift: the probe card is the interface of a testing machine and a semiconductor sample, and the position of the probe needle is designed according to the position of the chip of the semiconductor sample so that several chips can be tested simultaneously. Consequently, the position of the probe needle dominates the accuracy of the testing. The material used in the conventional probe card only works at a temperature range between 25° C. and 85° C., and the thermal expansion coefficient is different from one material to another. When testing is performed at a temperature beyond the range the material can sustain, the material will deform due to the thermal expansion coefficient, and the horizontal position of the probe needle will seriously shift. Furthermore, the probe needle may peel off or curve so as to fail to work. Additionally, the angle of the conventional probe needle to the surface of the circuit board is 103 degrees, designed to meet the limit of the fixture. When the testing temperature is increased or decreased, this 103-degree will further cause shifting of the probe needle and serious damage.

SUMMARY

The object of this disclosure is to provide a probe card for electrical testing a chip in a wide temperature range between −120° C. and 450° C. An embodiment of this invention moderates the temperature by using forced-air to carry heat into or out of the probe card.

In order to achieve the above-mentioned object and avoid the problems of the prior art, the present invention provides a probe card for electrical testing a chip in a wide temperature range at a temperature range between −120° C. and 450° C. The probe card of the present invention comprises a circuit board, a supporter positioned on the surface of the circuit board, at least a probe needle fixed on the supporter by an adhesive, a cover fixed on the circuit board and a flow line positioned in the space between the circuit board and the cover. A fluid can circulate in the flow line to moderate the temperature of the probe card. The present invention moderates the temperature by using a fluid such as forced-air or nitrogen to carry heat into or out of the probe card. Consequently, physical and chemical properties of the devices of the probe card will not vary excessively and the probe card can perform testing at a temperature range between −120° C. and 450° C.

Compared with the prior art, the present invention possesses the following advantages:
(1) The force-fluid design of the present invention uses the pressure difference to introduce the fluid into the flow line, and the circulation of the fluid moderates the temperature of the circuit board, the circular supporter, the epoxy adhesive and the probe needle. The present invention not only maintains the temperature of the probe card within the range the material of the probe card can sustain, but also controls the temperature of the probe card to reduce the variation in physical and chemical properties caused by thermal shrinking or expansion.
(2) The present invention enlarges the angle of the probe needle to a range between 135 and 182 degrees, and changes the angle of the circular supporter and the circuit board to a range between 11 and 75 degrees. The present invention not only increases the distance between the wafer chuck and the circular supporter to reduce the influence of temperature variation, but also effectively solves the problem in position shifting when testing is performed at the relatively high or low temperatures.

BRIEF DESCRIPTION OF THE DRAWINGS

Other objects and advantages of this disclosure will become apparent upon reading the following description and upon reference to the accompanying drawings in which.

DETAILED DESCRIPTION

Figure 1:
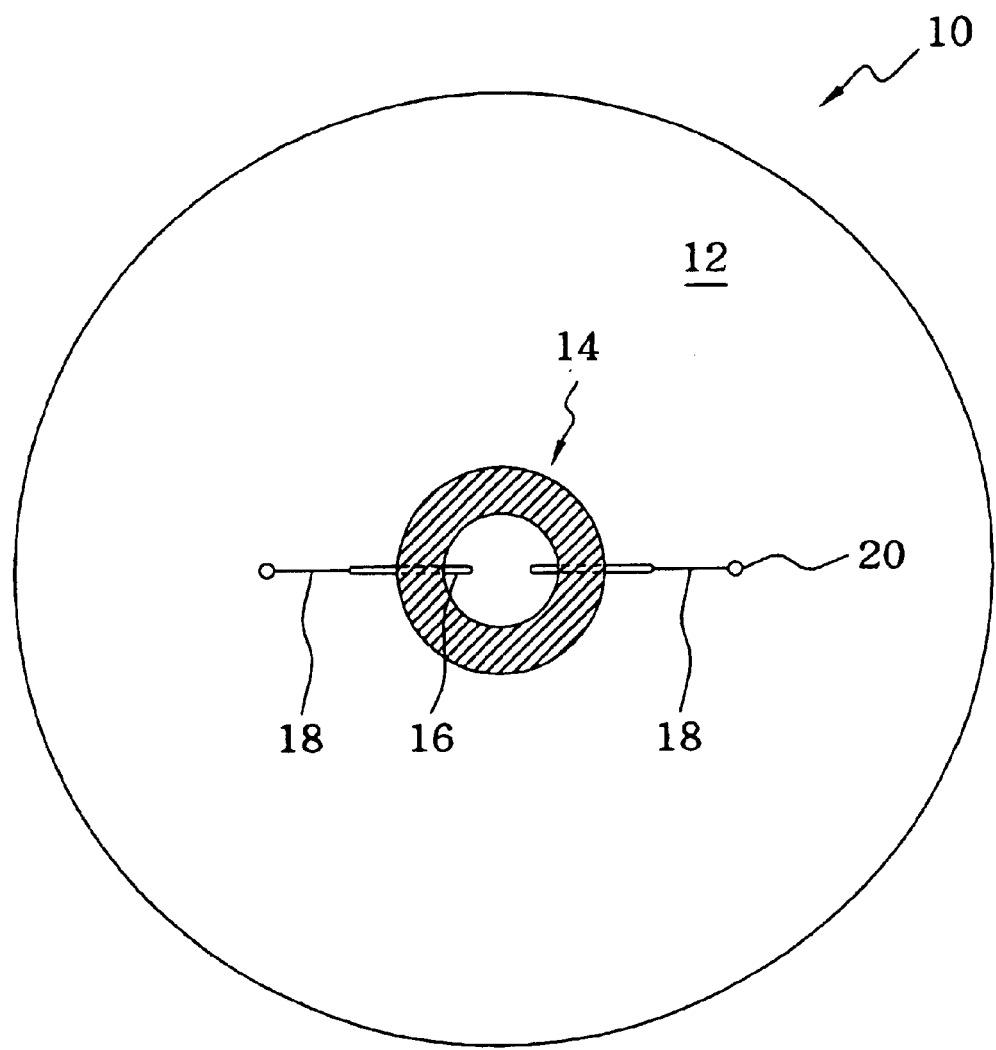
FIG. 1 us a top view of a probe card for testing a chip according to conventional art.
Figure 2:
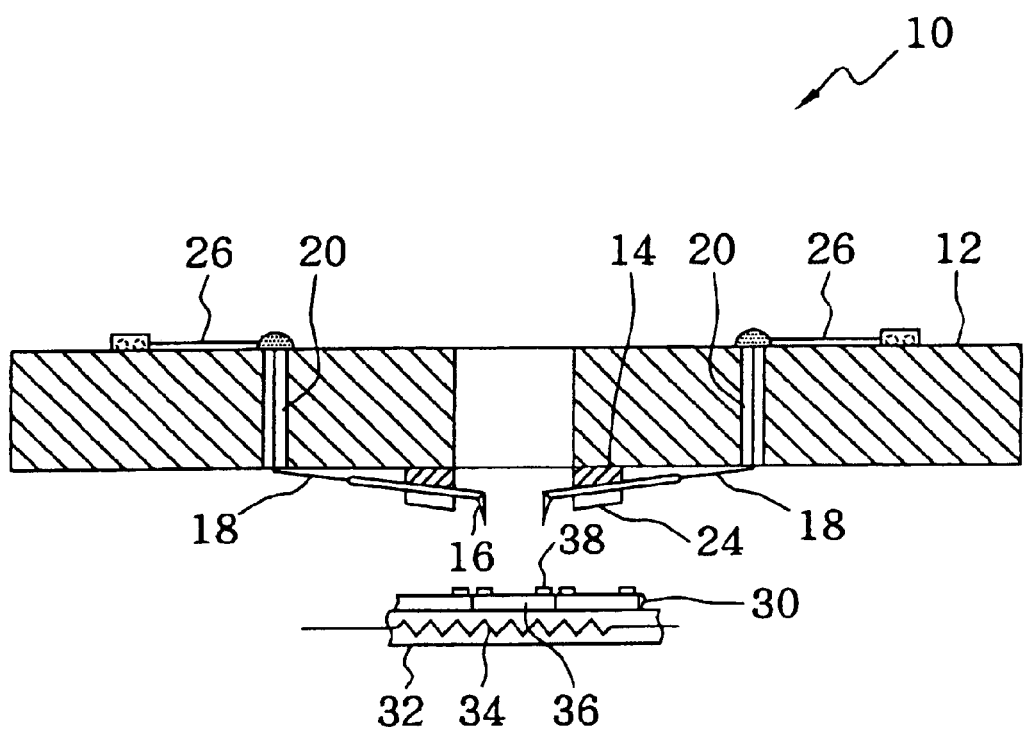
FIG. 2 is a cross-sectional diagram showing a probe card applied to the electrical testing of a chip of a wafer according to the conventional art.
Figure 3:
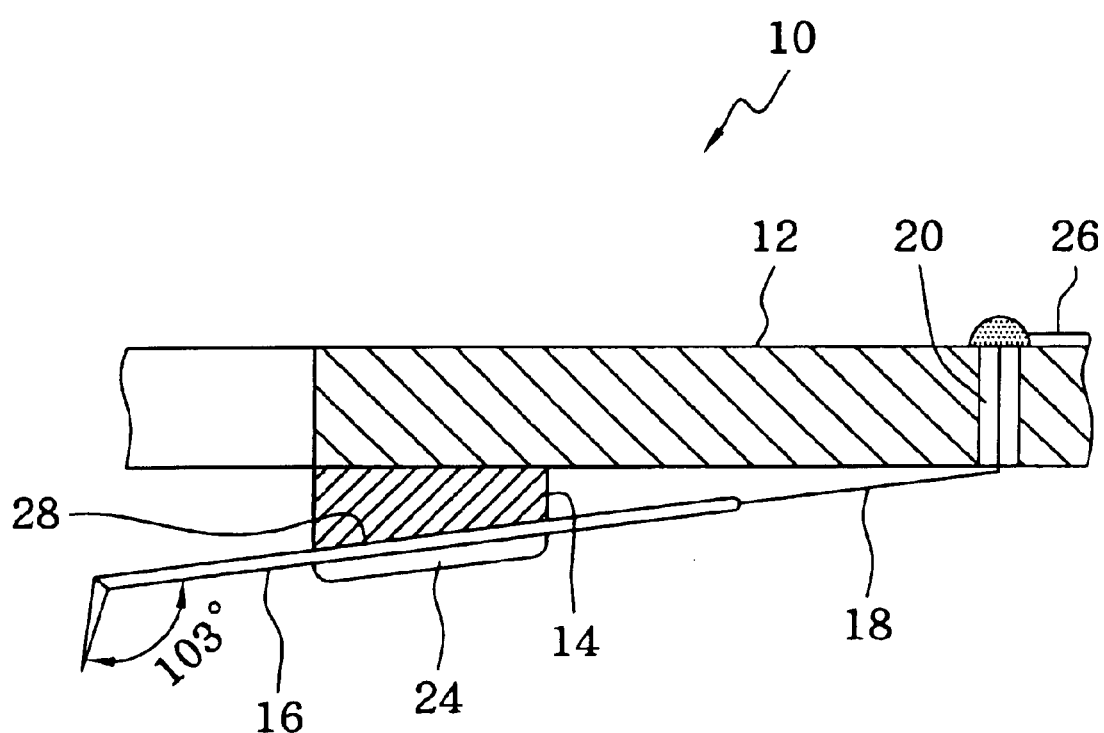
FIG. 3 is a close-up cross-sectional view of FIG. 2.
Figure 4:
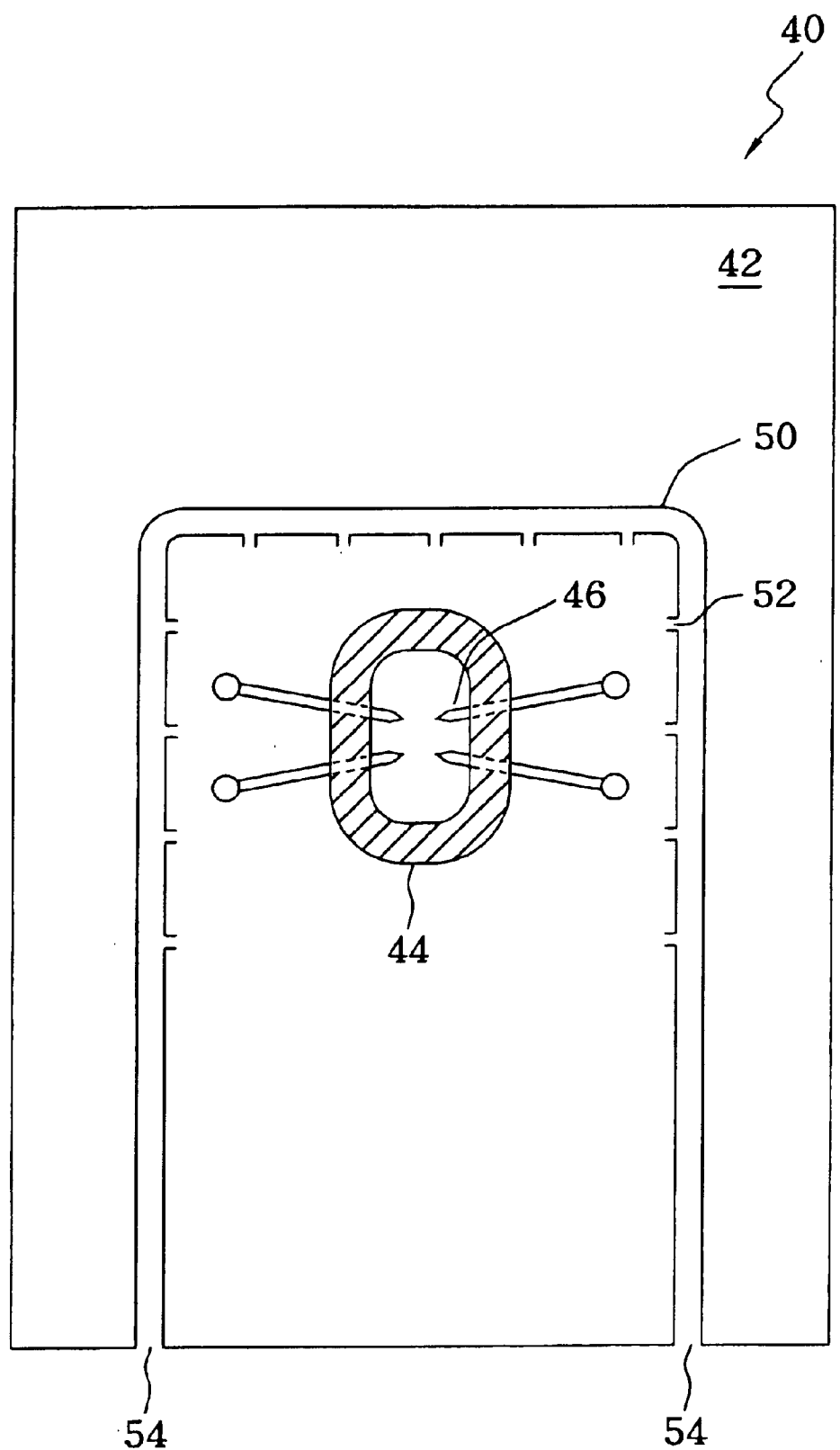
FIG. 4 is a top view of a probe card for electrical testing a chip in a wide temperature range according to an embodiment of the invention.

FIG. 4 is a top view of a probe card 40 according to an embodiment of the invention. The probe card 40 comprises a circuit board 42, a circular supporter 44 positioned on the circuit board 42, a plurality of probe needles 46 positioned on the circular supporter 44, and a flow line 50 positioned on the surface of the circuit board 42. The flow line 50 can be a guide tube, and the circuit board 42 and circular supporter 44 are made of ceramics that can sustain high temperature. The flow line 50 comprises two entrances 54 and a plurality of openings 52 toward to the circular supporter 44. The flow line 50 surrounds the circular supporter and the probe needles 46.

Figure 5:
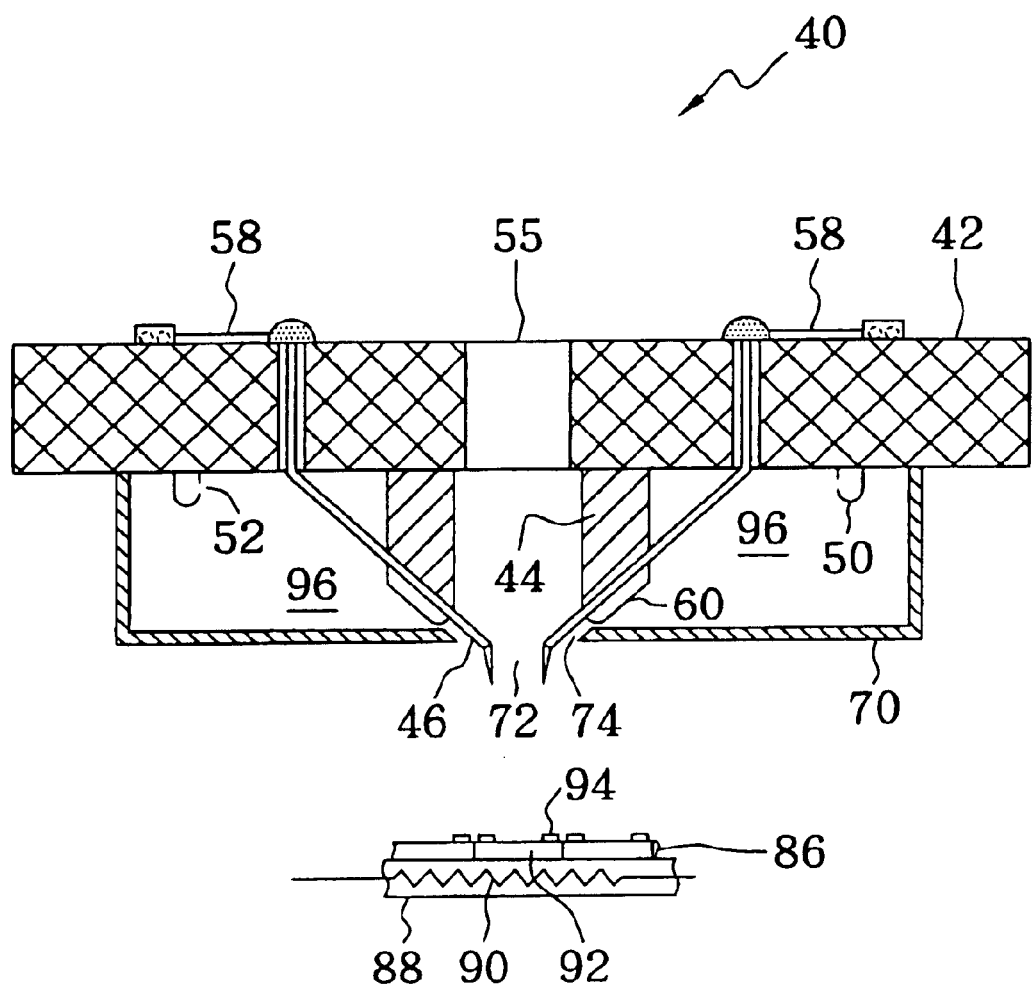
FIG. 5 is a cross-sectional diagram showing a probe card applied to the electrical testing of a chip of a wafer according to an embodiment of the invention.

FIG. 5 is a cross-sectional diagram showing the probe card 40 applied to the electrical testing of a chip 92 of a wafer 86 according to an embodiment of the invention. There is a central opening 55 for an operator to visually inspect the relative distance of the probe needle 46 and the semiconductor wafer 86. The probe needle 46 is fixed on the circular supporter 44 by an adhesive 60 such as epoxy resin, and connected to the wire 58 on the backside of the circuit board 42. The probe card 40 of this embodiment further comprises a cover 70 and the flow line 50 can be positioned in a space 96 between the circuit board 42 and the cover 70. For example, the flow line 50 can be positioned on the circuit board 42 or on the cover 70. The cover 70 comprises an opening 72 permitting the probe needle 46 to contact the semiconductor wafer 86. The semiconductor wafer 86 is positioned on a wafer chuck 88 with a heater 90, and comprises a plurality of chips 92. The wafer chuck 88 will rise during testing so that the tip of the probe needle 46 can contact a pad 94 of the chip 92.

The present invention moderates the temperature of the space 96 by using a fluid such as forced-air to carry heat out of the probe card 40 to fulfill the application of the probe card 40 to the electrical testing of the chip 92 at a high temperature. The forced-air is introduced into the probe card 40 through the entrances 54 of the flow line 50, puffs to the circular supporter 44 through the opening 52, and then carries heat out of the probe card 40 through the gap 74 formed between the cover 70 and the adhesive 60. Even if the heater 90 increases the temperature of the wafer chuck 88 to 450° C., this embodiment of the invention can maintain the temperature of the probe card 40 within a predetermined range by adjusting the flow rate and temperature of the force-air. As a result, the physical properties (thermal shrinking and thermal expansion) and chemical properties (decay of the epoxy resin) will not vary excessively, and the application of the probe card 40 to the electrical testing of the chip 92 at very high temperature is fulfilled. Typically, the temperature of the introduced force-air is approximately 25° C. and the pressure is at a range between 0 and 70 kpa.

Additionally, when the probe card 40 is applied to the electrical testing of the chip 92 at very low temperature, dry nitrogen with a temperature 0° C. is introduced into the flow line 50 to moderate the temperature of the probe card 40. As a result, the probe card 40 of this embodiment can be used to perform testing at a temperature down to −120° C. In brief, the flow line 50 permits a fluid to flow in the space 96 for maintaining the temperature of the probe card 40 within a predetermined range (for example between 25° C. and 85° C.) when the chip 92 is under test at a temperature up to 450° C. or down to −120° C. which is outside the predetermined range.

Figure 6:
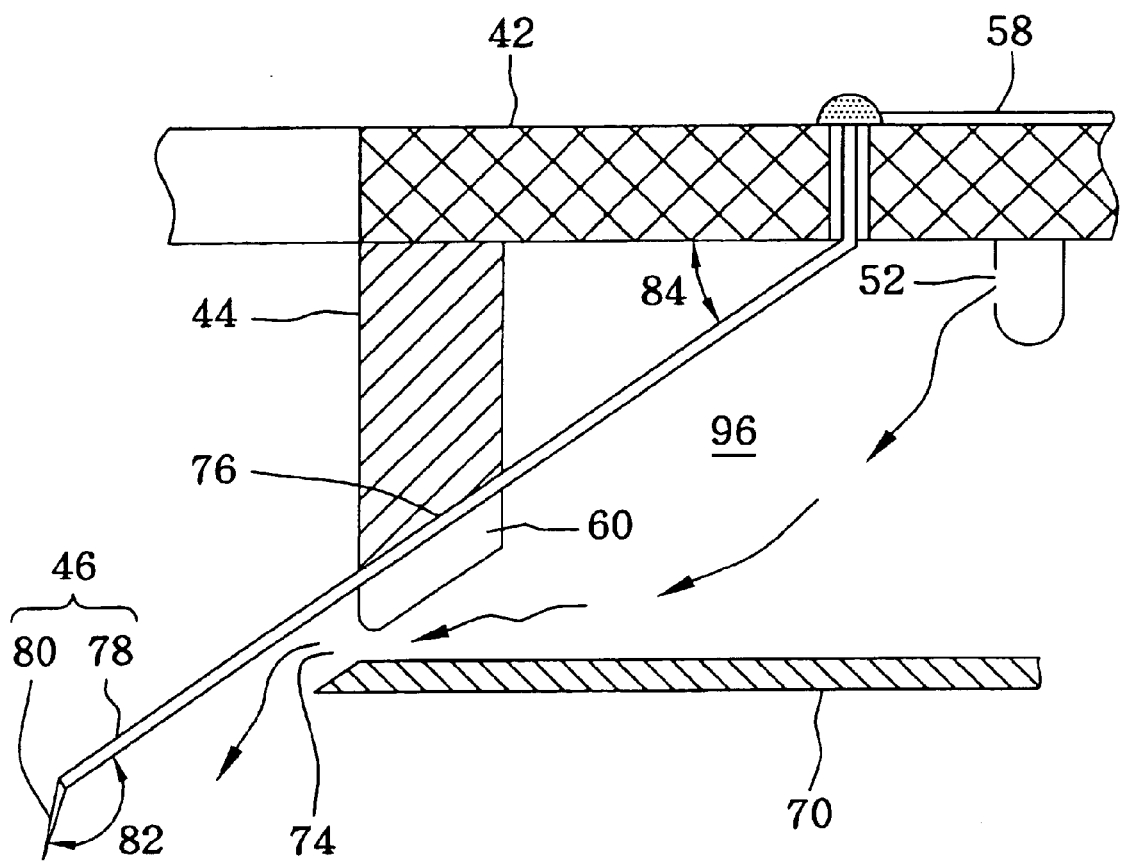
FIG. 6 is a close-up cross-sectional view of FIG. 5.

FIG. 6 is a close-up cross-sectional view of FIG. 5. The introduced fluid flows in the space 96 between the cover 70 and the circuit board 42 as indicated by the arrows. A thermal exchange occurs between the fluid and the adhesive 60, the probe needle 46, the circular supporter 44 and the circuit board 42. The fluid then flows out of the probe card 40 through the gap 74 formed between the cover 70 and the adhesive 60 so as to moderate the temperature of the probe card 40. Besides, the circular supporter 44 has an incline 76 and the probe needle 46 is fixed on the incline 76 by the adhesive 60. The included angle 84 between the incline 76 and the surface of the circuit board 42 is in a range between 11 and 75 degrees, and the included angle 84 is preferably 45 degrees. The probe needle 46 can consist of a cantilever 78 and a tip portion 80, and the included angle 82 between the cantilever 78 and the tip portion 80 is in a range between 135 and 180 degrees. Additionally, the probe needle 46 can be formed as a single unit, i.e., the included angle between the cantilever 78 and the tip portion 80 is 180 degrees. This embodiment controls the factors causing the shifting of the probe needle 46 by adjusting the included angle 84 to a range between 11 and 75 degrees, and by adjusting the included angle 82 to a range between 135 and 180 degrees. As a result, the displacement of the probe needle 44 from the thermal shrinking through expansion of the material is reduced to ½, and the shifting problem of the probe needle at high temperatures is effectively solved.

Compared with the conventional art, embodiments of the invention possess the following advantages:

(1) The force-fluid design of embodiments of the invention uses the pressure difference to introduce the fluid into the flow line, and the circulation of the fluid moderates the temperature of the circuit board, the circular supporter, the epoxy adhesive and the probe needle. These embodiments not only maintain the temperature of the probe card within a range the material of the probe card can sustain, but also control the temperature of the probe card to reduce the variation in physical and chemical properties caused by thermal shrinking or expansion.

(2) Embodiments of the invention enlarge the angle of the probe needle to a range between 135 and 182 degrees, and change the angle of the circular supporter and the circuit board to a range between 11 and 75 degrees. The disclosed embodiment not only increases the distance between the wafer chuck and the circular supporter to reduce the influence of temperature variation, but also effectively solves the problem of position shifting when testing is performed at relatively high or low temperatures.

The above-described embodiments of the present invention are intended to be illustrative only. Numerous alternative embodiments may be devised by those skilled in the art without departing from the scope of the following claims.

What is claimed is:

1. A probe card for electrical testing a chip in a wide predetermined temperature range, the probe card comprising:

a circuit board;

a supporter positioned on the circuit board;

at least one probe needle fixed on the supporter; and at least one gas flow line positioned on a surface of the circuit board, wherein the at least one gas flow line is arranged to permit a fluid to flow on the surface of the circuit board so as to maintain a temperature of the probe card within the predetermined range when the chip is at a temperature outside the predetermined range.

2. The probe card of claim 1, wherein the gas flow line is a guide tube including at least an opening toward the supporter.

3. The probe card of claim 2, wherein the guide tube surrounds the supporter and includes a plurality of openings toward the supporter.

4. The probe card of claim 1, wherein the supporter includes an incline and an angle between the incline and the surface of the circuit board is more than 11 degrees.

5. The probe card of claim 1, wherein the supporter includes an incline and an angle between the incline and the surface of the circuit board is less than 75 degrees.

6. The probe card of claim 1, wherein the supporter includes an incline and an angle between the incline and the surface of the circuit board is approximately 45 degrees.

7. The probe card of claim 1, further comprising a cover fixed on the circuit board, wherein the cover includes at least an opening permitting the at least one probe needle to contact the chip.

8. The probe card of claim 7, wherein the circuit board and the supporter comprise ceramics.

9. The probe card of claim 1, wherein the at least one probe needle comprises a cantilever and a tip portion, and an included angle between the cantilever and the tip portion is between 180 and 135 degrees.

10. A probe card for electrical testing a chip in a wide predetermined temperature range, the probe card comprising:

a circuit board;

a supporter positioned on the circuit board;

at least one probe needle fixed on the supporter;

a cover positioned on the circuit board; and at least one flow line positioned in a space between the circuit board and the cover, wherein the flow line is arranged to permit a fluid to flow in the space and to adjust a temperature of the probe card within the predetermined range when the chip is at a temperature outside the predetermined range.

11. The probe card of claim 10, wherein a pressure of the fluid is less than 70 kpa.

12. The probe card of claim 10, wherein the fluid comprises air at a temperature of approximately 25° C.

13. The probe card of claim 10, wherein the fluid comprises nitrogen at a temperature of approximately 0° C.

14. The probe card of claim 10, wherein the flow line comprises a guide tube including at least an opening toward the supporter.

15. The probe card of claim 14, wherein the guide tube surrounds the supporter and includes a plurality of openings toward the supporter.

16. The probe card of claim 10, wherein the supporter includes an incline and an included angle between the incline and the surface of the circuit board is more than 11 degrees.

17. The probe card for electrical testing a chip in a wide temperature range of claim 10, wherein the supporter includes an incline, and an included angle between the incline and a surface of the circuit board is less than 75 degrees.

18. The probe card for electrical testing a chip in a wide temperature range of claim 10, wherein the supporter includes an incline and an included angle between the incline and a surface of the circuit board is approximately 45 degrees.

19. The probe card for electrical testing a chip in a wide temperature range of claim 10, wherein the circuit board and the supporter comprise ceramics.

20. The probe card of claim 10, wherein the at least one probe needle comprises a cantilever and a tip portion, and an included angle between the cantilever and the tip portion is in a range of 135 to 180 degrees.

* * * * *